United States Patent
Park et al.

(10) Patent No.: US 8,389,408 B2
(45) Date of Patent: Mar. 5, 2013

(54) METHODS OF FORMING A SEMICONDUCTOR DEVICE INCLUDING A METAL SILICON NITRIDE LAYER

(75) Inventors: Young-Lim Park, Hwaseong-si (KR); Jinil Lee, Seongnam-si (KR); Changsu Kim, Hwaseong-si (KR); Sugwoo Jung, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 120 days.

(21) Appl. No.: 12/821,924

(22) Filed: Jun. 23, 2010

(65) Prior Publication Data

US 2011/0003477 A1 Jan. 6, 2011

(30) Foreign Application Priority Data

Jul. 1, 2009 (KR) ................. 10-2009-0059686

(51) Int. Cl.
*H01L 21/30* (2006.01)
(52) U.S. Cl. .................. 438/680; 257/E21.211
(58) Field of Classification Search .......... None
See application file for complete search history.

(56) References Cited

U.S. PATENT DOCUMENTS 7,253,108 B2  8/2007  Zonca
7,625,820 B1 * 12/2009 Papasouliotis et al. ....... 438/677

FOREIGN PATENT DOCUMENTS

KR  1020050019382 A  3/2005
KR  1020060091240 A  8/2006
KR  1020080011702 A  2/2008

* cited by examiner

*Primary Examiner* — Seahvosh Nikmanesh
(74) *Attorney, Agent, or Firm* — Myers Bigel Sibley & Sajovec, PA

(57) ABSTRACT

Provided are methods of forming a semiconductor device. The methods include providing a first precursor and a substitute gas into a reaction chamber having a substrate therein, the first precursor having a first substituent and further providing a second precursor into the reaction chamber. Either the first precursor or the second precursor includes a metal element and the other includes a silicon element, at least one of the first substituents of the first precursor are substituted with the substitute gas, the first precursor substituted with the substitute gas is adsorbed onto the substrate, and the second precursor is reacted with the adsorbed first precursor.

14 Claims, 5 Drawing Sheets

METHODS OF FORMING A SEMICONDUCTOR DEVICE INCLUDING A METAL SILICON NITRIDE LAYER

CROSS-REFERENCE TO RELATED APPLICATIONS

This application claims priority under 35 U.S.C. §119 to Korean Patent Application No. 10-2009-0059686, filed on Jul. 1, 2009, the entire contents of which are hereby incorporated by reference.

FIELD OF THE DISCLOSURE

The present disclosure herein relates to methods of forming a semiconductor device, and more particularly, to methods of forming a semiconductor device having a metal silicon nitride layer.

BACKGROUND

An effort for improving device density is continuing in the fabrication of semiconductor devices. For improving the device density, it may be possible to miniaturize elements of the device and reduce the driving current of the device.

For example, in a phase-changeable memory device that uses phase changeable material as a memory element, thermal and/or electric factors may be controlled so as to control the driving current of a memory cell. Thus, various methods are being investigated for transmitting the thermal and/or electric factors efficiently through and/or between a phase-changeable material and a heating electrode.

SUMMARY

Embodiments of the inventive concept provide methods of forming a semiconductor device having reduced driving current.

Embodiments of the inventive concept provide methods of forming a semiconductor device of which endurance is improved.

Embodiments of the inventive concept provide methods of forming a semiconductor device of which efficiency is improved.

Embodiments of the inventive concept provide methods of forming a semiconductor device including: optionally providing a substrate in a reaction chamber; providing a first precursor and a substitute gas into the reaction chamber, the first precursor having a first substituent; and providing a second precursor into the reaction chamber. One of the first precursor and the second precursor may include a metal element and the other may include a silicon element, at least one of the first substituent of the first precursor are substituted with the substitute gas at a region spaced apart from the substrate, the first precursor substituted with the substitute gas may be adsorbed on the substrate, and the second precursor may be reacted with the adsorbed first precursor.

In some embodiments, at least one of the first substituent may be substituted with the substitute gas, after adsorbing the first precursor onto the substrate.

In other embodiments, the first precursor and the substitute gas may be simultaneously provided into the reaction chamber.

In still other embodiments, the precursor including the silicon element may include a substituent which has a carbon directly bonded to the silicon element, and at least one of the substituents with the carbon is not substituted with the substitute gas.

In other embodiments, each of the first substituent and the substitute gas may include an amine group. In this case, the first substituent is substituted with the substitute gas by transamination between the first precursor and the substitute gas.

The first substituent may be NRR', where each of R and R' may be one selected from $C_nH_{2n+1}$ (n is an integral number in the range from 0 to 10), $C_nH_{2n-1}$ (n is an integral number in the range from 1 to 12) and —CH=C=CH$_2$.

The substitute gas may be $NR_nH_{3-n}$ or $N_2R_nH_{4-n}$, where n is an integral number in the range from 0 to 2.

In yet some embodiments, the first substituent may include the same amine group as the substitute gas.

In yet other embodiments, the second precursor may include a second substituent, the method further comprises providing a substitute gas into the reaction chamber, and substituting the second substituent with the substitute gas.

In yet further embodiments, the second substituent may include at least one carbon element, and the substitute gas is provided simultaneously with the second precursor.

BRIEF DESCRIPTION OF THE DRAWINGS

The accompanying drawings are included to provide a further understanding of the inventive concept, and are incorporated in and constitute a portion of this specification. The drawings illustrate exemplary embodiments of the inventive concept and, together with the description, serve to explain principles of the inventive concept. In the figures.

DETAILED DESCRIPTION

Exemplary embodiments of the inventive concept will be described below in more detail with reference to the accompanying drawings. The embodiments of the inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

Hereinafter, exemplary embodiments of the inventive concept will be described in detail with reference to the accompanying drawings.

Figure 1:
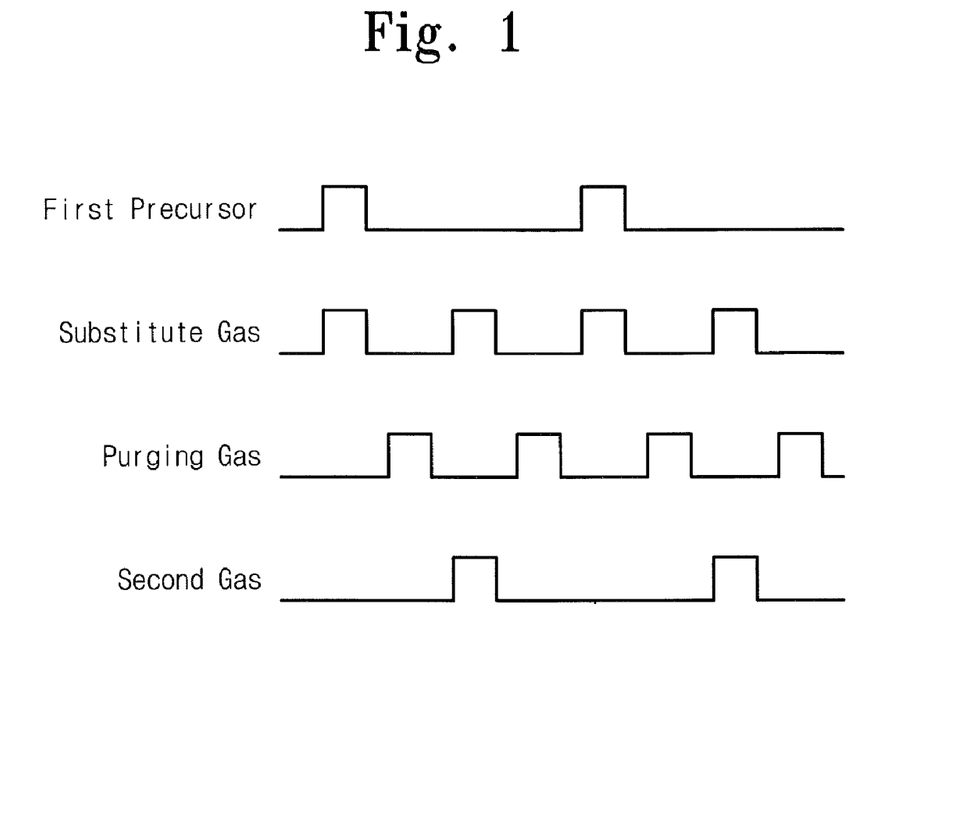
FIG. 1 is a gas injection diagram illustrating an embodiment of the inventive concept.

FIG. 1 is a gas injection diagram illustrating an embodiment of the inventive concept.

Figure 2:
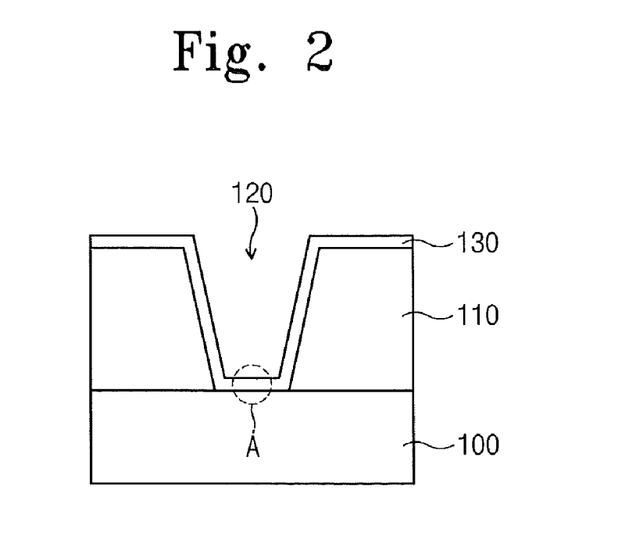
FIG. 2 is a view illustrating a semiconductor device according to an embodiment of the inventive concept.

FIG. 2 is a view illustrating a semiconductor device according to an embodiment of the inventive concept.

FIGS. 3A through 3D are expansion views of 'A' region in FIG. 2 to illustrate a reaction that may occur in a reaction chamber, when a process according to an embodiment of the inventive concept is performed.

Referring to FIGS. 1, 2 and 3A through 3D, a substrate 100 may be loaded into a reaction chamber. The substrate 100 may be a semiconductor substrate which is formed of a semiconductor element, for example, a 4A group element. An interlayer dielectric layer 110 may be disposed on the substrate 100. The substrate 100 may include a conductive region, an isolation region and/or a conductive component which is connected with the conductive region.

A contact hole 120 may be formed on the substrate 100. The contact hole 120 may include a sidewall defined by the interlayer dielectric layer 110 and a bottom defined by the substrate 100. The conductive component of the substrate 100 may be exposed by the bottom of the contact hole 12. The contact hole 120 may be geometrically defined aperture such as a circular, a polygonal or a linear aperture.

A first precursor and a substitute gas are injected into the reaction chamber in which the substrate 100 has been loaded. The first precursor and the substitute gas may be simultaneously injected into the reaction chamber. The first precursor and/or the substitute gas may be injected into the reactive chamber as a gaseous state or radical state.

The first precursor may be a metal precursor having a first substituent. The first substituent may be an amine group. For example, the first precursor may be $MR_n(NR'R'')_{4-1}$ (n is a integral number not exceeding 3), where each of R, R' and R'' is one selected from $C_nH_{2n+1}$ (n is an integral number in the range from 0 to 10), $C_nH_{2n-1}$ (n is an integral number in the range from 1 to 12) and —CH=C=CH$_2$, and M is one selected from a suitable metal element as understood by one skilled in the art. For example, M may be, but is not limited to, titanium or tantalum.

The substitute gas may include an amine group. The substitute gas may be $NR_nH_{3-n}$ (n is an integral number in the range from 0 to 2) or $N_2R_nH_{4-n}$ (n is an integral number in the range from 0 to 2), where R is one selected from $C_nH_{2n-1}$ (n is an integral number in the range from 0 to 10), (n is an integral number in the range from 1 to 12), and —CH=C=CH$_2$. For example, the substitute gas may have a fewer number of carbons than the first substituent of the first precursor. For example, the substitute gas may be ammonia ($NH_3$).

Figure 3A:
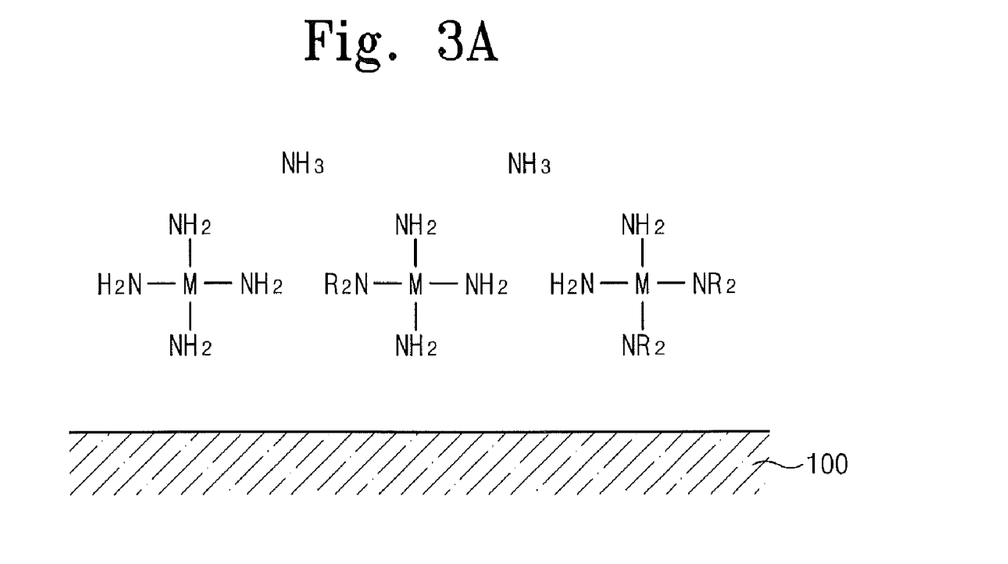
FIGS. 3A through 3D are views illustrating a method of forming a semiconductor device according to an embodiment of the inventive concept.

Referring to FIG. 3A, transamination may occur between the first precursor and the substitute gas that are simultaneously injected into the reaction chamber. Thus, the first substituents of the first precursor may be substituted with the amine group of the substitute gas. At least one of the first substituents of the first precursor may be substituted with the substitute gas. Therefore, a first precursor without the amine group of the substitute gas, a first precursor with the first substituent and the amine group of the substitute gas, and a first precursor with the amine group of the substitute gas and without the first substituent can coexist in the reaction chamber.

Specifically, the first precursor may be [Tetrakis(di-methylamino)titanium] (TDMAT) and the substitute gas may be ammonia ($NH_3$). TDMAT includes four amine groups (di-methylamine group, $NMe_2$) that bind to titanium. Each amine group includes two methyl groups. The amine groups may be bound to the titanium.

If the substitute gas is provided into the reactive chamber simultaneously with the first precursor, at least one of the four amine groups is substituted with an amine group of the ammonia, that is, an amino group. A portion of the first precursor remains in the reaction chamber without substituting the first substituent with the amino group of the substitute gas. Thus, $Ti(NH_2)_4$, $Ti(NH_2)_3NMe_2$, $Ti(NH_2)_2(NMe_2)_2$, $Ti(NH_2)(NMe_2)_3$ and $Ti(NMe_2)_4$ can coexist in the reaction chamber. $Ti(NH_2)_4$ may be a chemical species of which all amine groups (di-methylamine group, $NMe_2$) that may bind to titanium are substituted with the amine groups (amino group, $NH_2$) of the substitute gas. $Ti(NMe_2)_4$ may be a chemical species of which no amine groups of the first precursor is substituted with the amine group (amino group) of the substitute gas.

Figure 3B:
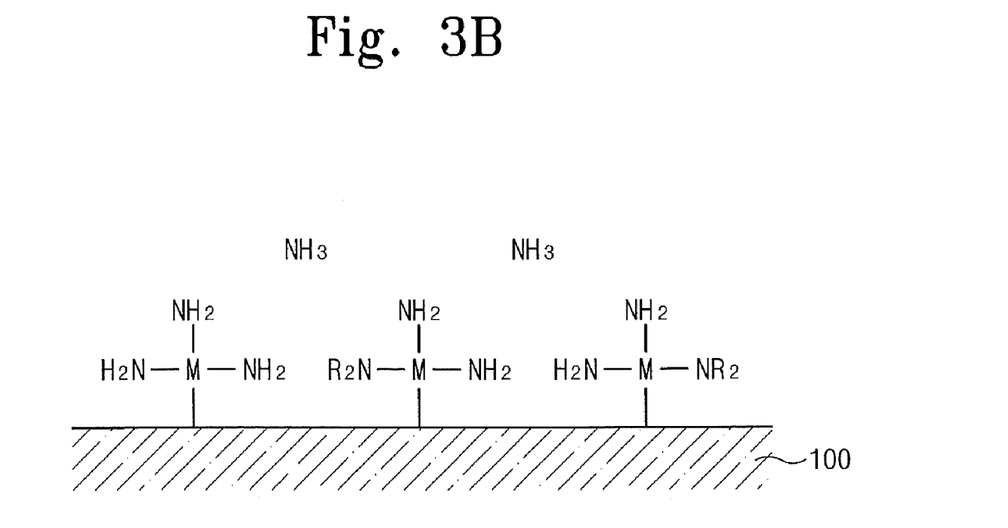

Referring to FIG. 3B, the substituted first precursor of which at least one of the amine groups is substituted with the amine group of the substitute gas may be adsorbed onto the substrate 100. An unsubstituted first precursor of which no amine groups are substituted with the amine group of the substitute gas may also be adsorbed onto the substrate 100.

In an embodiment of the inventive concept, the injection time of the substitute gas may be longer than that of the first precursor. For example, the substitute gas and the first precursor may be injected into the reactive chamber simultaneously for a predetermined time, and then the substitute gas may be continuously injected while stopping the injection of the first precursor.

As the injection time of the substitute gas is longer than that of the first precursor, a first substituent of the adsorbed first precursor can be substituted with an amine group of the substitute gas. That is, transamination can occur between amine groups of the first precursor and the substitute gas while the first precursor is adsorbed onto the substrate 100.

Alternatively, the injection time of the substitute gas may be the same as that of the first precursor. Accordingly, the substitute gas may be injected more than a stoichiometric amount. A stoichiometric amount refers to the amount in which all the first substituent of the first precursors can be substituted with amine groups of the substitute gas.

According to at least some embodiments of the inventive concept, a content of unbound carbons may be reduced, which do not bind with other elements of the layer. Carbons contained in the amine groups may be isolated from nitrogen, thereby existing in the layer as a carbon state or a carbon compound state without binding with other elements. These unbound carbons may be contaminations which deteriorate characteristics of the layer.

According to still further embodiments of the inventive concept, however, carbons contained in the amine groups can be removed effectively to reduce the content of the unbound carbons in the layer. Specifically, substituents of the first precursor containing a carbon may be removed from the first precursor through transamination at a region spaced apart from the substrate 100. Substituents of the first precursor containing a carbon may be additionally removed after adsorbing the first precursor on the substrate 100. Thus, according to embodiments of the inventive concept, the layer can be formed with a reduced content of the unbound carbons.

Subsequently, a purging gas may be injected into the reaction chamber. The purging gas can purge the first precursor and the substitute gas that are not adsorbed onto the substrate. The purging gas may be one selected from inert gases including argon (Ar) and nitrogen ($N_2$). The purging gas may be injected into the reaction chamber simultaneously with the first precursor and/or the substitute gas injection. Alternatively, the purging gas may be injected into the reaction chamber after injecting the first precursor and/or the substitute gas.

Figure 3C:
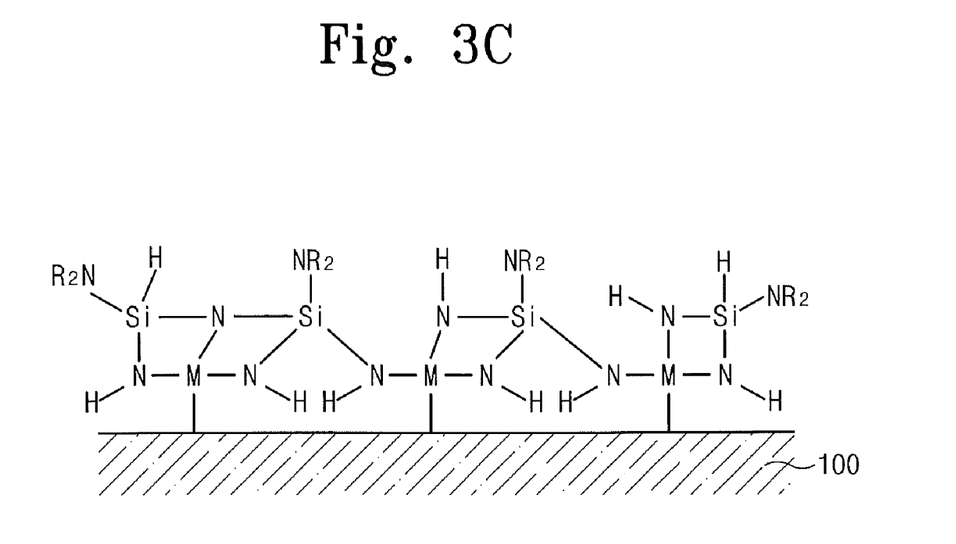

Referring to FIG. 3C, a second precursor is provided into the reaction chamber. The second precursor may be a silicon compound in which a second substituent is included. The second substituent may be an amine group. For example, the second precursor may be $SiR_n(NR'R'')_{4-1}$, where n is an integral number not exceeding 3. Here, each of R, R', R'' is one selected from $C_nH_{2n+1}$ (n is an integral number in the range from 0 to 10), $C_nH_{2n-1}$ (n is an integral number in the range from 1 to 12), and —CH═C═CH$_2$. The second precursor may be injected in the state of a gas or radical.

Figure 3D:
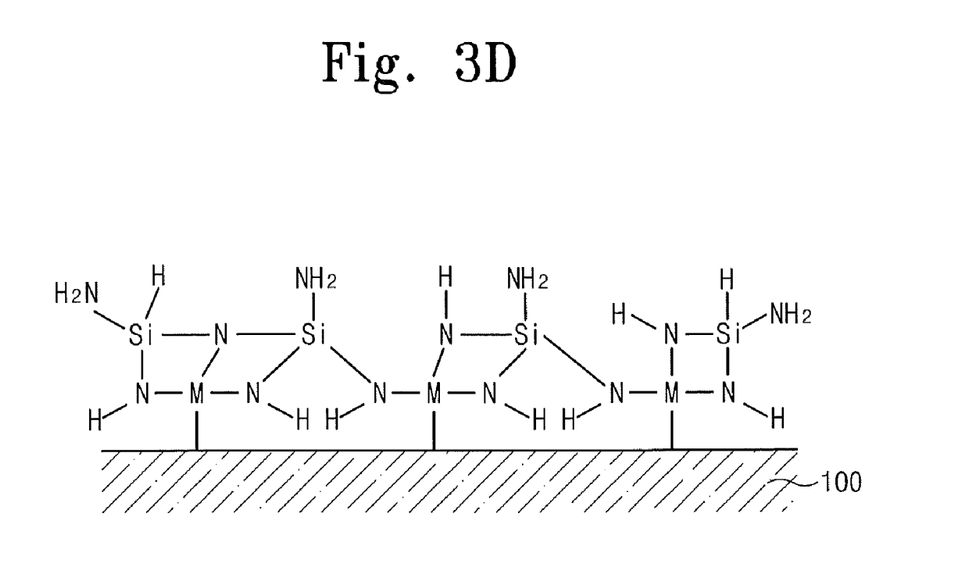

Referring to FIG. 3D, a substitute gas may be injected into the reaction chamber. The substitute gas may be injected simultaneously with the second precursor. The substitute gas may be injected after injecting the second precursor. Alternatively, the substitute gas may be injected simultaneously with the second precursor and after injecting the second precursor.

The substitute gas may include an amine group. This substitute gas may be an identical material to the substitute gas that has been injected with the first precursor. For example, the substitute gas may be ammonia gas.

When the second precursor and the substitute gas are simultaneously injected into the reaction chamber, the second substituent of the second precursor may be substituted with the amine group of the substitute gas in the reaction chamber spaced apart from the substrate 100. That is, transamination may occur between the amine groups of the second precursor and the substitute gas. As a result, the second precursor can include an amine group of the substitute gas as a substituent.

When the second precursor includes a plurality of amine groups, at least one or all of the amine groups may be substituted with the amine group of the substitute gas.

The substituted second precursor, of which the amine group is substituted with the amine group of the substitute gas, may bind to the first precursor that is adsorbed on the substrate. According to embodiments of the inventive concept, silicon of the second precursor may bind to nitrogen of the first precursor. The unsubstituted second precursor of which no amine group is substituted with the amine group of the substitute gas may bind to the adsorbed first precursor on the substrate.

Specifically, by injecting the second precursor, a bond may be formed between the silicon of the second precursor and the metallic element of the first precursor. Another bond may also be formed between the silicon of the second precursor and the nitrogen of the first precursor. The bonds between the elements may be a single bond or a double bond.

A purging gas may be further injected into the reaction chamber. The purging gas may purge the second precursor that does not bind to the first precursor. The purging gas may be injected simultaneously and/or separately with the second precursor.

The injecting of the first precursor, the second precursor, the substitute gas and the purging gas may be performed multiple times. The content ratio of elements in the layer, thickness and/or electrical characteristics of the layer can depend on injection number and/or injection times of the first and the second precursor.

For example, the resistivity of the layer can be adjusted by controlling the injection number and/or the injection time of the first and the second precursor. When the first precursor includes a metallic element and the second precursor includes a silicon atom, the layer can be formed with higher resistivity as a result of increasing the injection time and/or number of injections of the second precursor. According to embodiments of the inventive concept, the layer having a resistivity higher than a metal layer can be formed without an oxidation process to the metal layer.

These characteristics may be useful to form a heating electrode of a phase changeable memory device. In the phase changeable memory device, the contact area between a phase changeable layer and the heating electrode may be reduced and/or the resistivity of the heating electrode may be increased to reduce the driving current of the device. The resistivity of the heating electrode can be increased by forming a metal layer and oxidizing the metal layer to from the heating electrode. However, it may be difficult to control the resistivity of the heating electrode at least because the oxidation level of the metal layer may be difficult to adjust. In contrast, in embodiments of the inventive concept, the resistivity of the heating electrode can be effectively adjusted by controlling the injection time and/or the injection number of the precursor including an insulating material, for example, the second precursor described above.

The procedure of injecting the first precursor and the second precursor may be modified. In this case, the resistivity of the layer can also be effectively adjusted by controlling the injection time and/or injection number. Specifically, the first precursor may be injected into the reaction chamber after simultaneously injecting the second precursor and the substitute gas into the reaction chamber. In this case, the second substituent (amine group) of the second precursor may be substituted with the amine group of the substitute gas in the chamber spaced apart from the substrate. Then, substituted second precursors for which at least one of the amine groups is substituted with the amine group of the substitute gas may be adsorbed onto the substrate. Unsubstituted second precursors for which no amine group is substituted with the amine group of the substitute gas may also be adsorbed onto the substrate. A substitute gas is further injected into the chamber such that the second substituent of the adsorbed second precursors may be substituted with the amine group of the substitute gas. Subsequently, the first precursor may be injected into the chamber to react with the adsorbed second precursor. A purging gas may be injected into the chamber after and/or simultaneously with injecting the first precursor, the second precursor and the substitute gas.

Referring to FIG. 2, an interlayer insulating layer 110 is disposed on a substrate 100. The substrate 100 may be a semiconductor layer based on a semiconductor element, for example, a 4A group element. A conductive region and/or an insulating region may be disposed on the substrate 100. The substrate 100 may also include a conductive element that is connected with the conductive region. A contact hole 120 may be disposed through the interlayer insulating layer 110 on the substrate 100. At least a portion of the conductive region and/or the conductive element may be exposed in the contact hole 120.

A conductive layer 130 may be formed on the substrate 100. The conductive layer 130 may be a metal silicon nitride. The conductive layer 130 may include metal, silicon and nitrogen. For example, the conductive layer 130 may be titanium silicon nitride.

The conductive layer 130 may contain carbon. A carbon atom in the conductive layer 130 may bind to the metal, silicon and/or nitrogen. For example, the carbon may exist in the conductive layer 130 in the state of binding to the silicon. The contents of silicon, carbon and nitrogen in the conductive layer 130 may be different in accordance with the resistivity of the conductive layer 130. In some embodiments of the inventive concept, The content of silicon in the conductive layer 130 is in the range from 0.1 at. % to 25 at. %, the content of carbon in the conductive layer is in the rage from 0.1 at. % to 30 at. %. In this case, resistivity of the conductive layer 130 may be in the range from 0.1 mΩ·cm to 100 mΩ·cm. When a heating electrode of the phase changeable memory device is formed of the conductive layer 130 that has a resistivity in the above range, the reset current may be 300 μA and below.

Figure 4A:
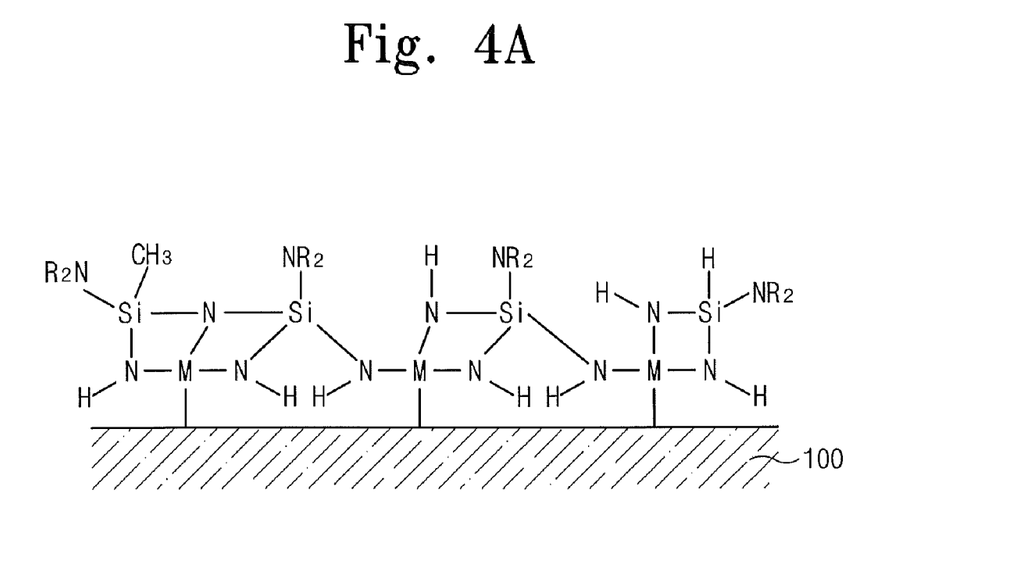
FIGS. 4A and 4B are views illustrating a method of forming a semiconductor device according to other embodiment of the inventive concept.
Figure 4B:
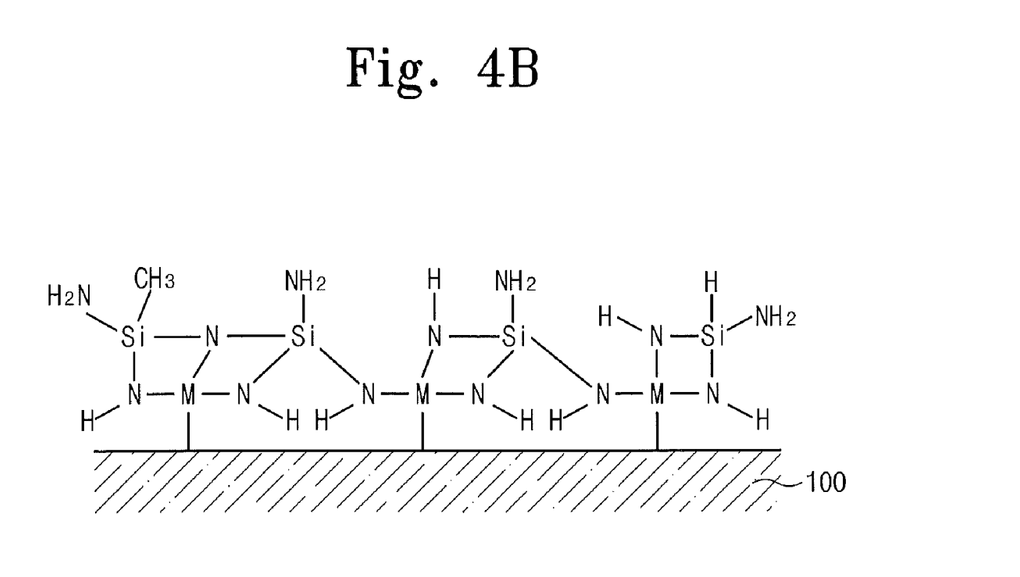

FIGS. 4A and 4B are views illustrating a method of forming a semiconductor device according to other embodiments of the inventive concept. In this embodiment, the second precursor described referring to FIGS. 3A through 3D is selected from organic silicon compounds.

Referring to FIGS. 4A and 4B, as described above, a substrate 100 may be loaded into the reaction chamber. A first precursor, a substitute gas and a purging gas is injected into the reaction chamber in which the substrate 100 has been loaded. Therefore, the first precursor may be adsorbed onto the substrate 100 as shown in FIG. 3B.

A second precursor may be provided on the substrate 100 on which the first precursor is adsorbed. The second precursor may include a carbon atom directly bonded to silicon. The second precursor may include an amine group. The amine group may be an organic amine group that contains a carbon atom.

The second precursor may be injected into the reaction chamber simultaneously with a substitute gas. Alternatively, the second precursor may be injected into the reaction chamber separately from the substitute gas.

The substitute gas may remove carbon atoms in the organic amine group of the second precursor. Specifically, transamination may occur between the amine group of the substitute gas and the organic amine group of the second precursor. In contrast, the carbon atom directly bonded to the silicon may not be removed. Thus, the carbon atom bonded to the amine group of the second precursor can be removed without removing the carbon atom directly bonded to the silicon, by injecting the substitute gas.

Carbons bonded to the amine group can be separated from the amine group. Carbon separated from the amine group and a chemical species containing a carbon may remain in the layer without bonding to other elements of the layer. In this case, the carbon and the chemical species containing a carbon causes deterioration to the characteristic of the layer.

In contrast, the carbon directly bonded to the silicon can bond to other elements of the layer. As a result, the layer can be formed with improved endurance.

Figure 5:
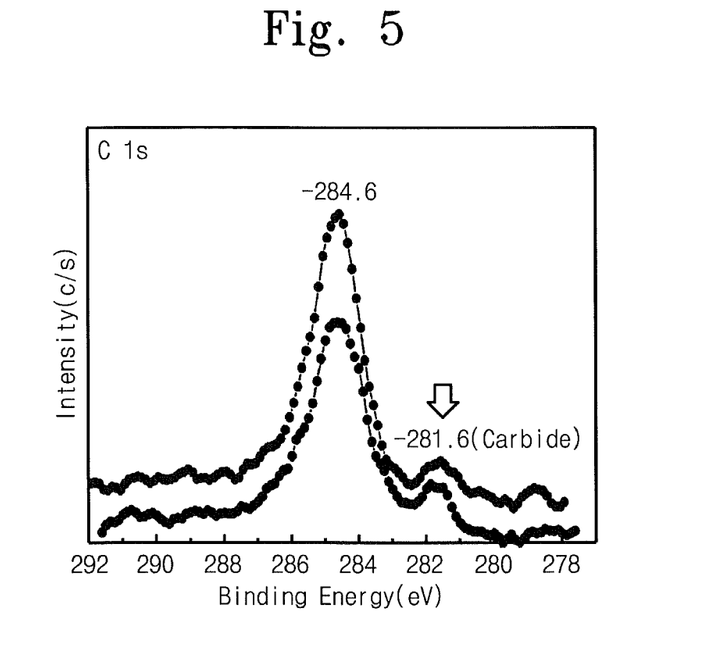
FIGS. 5 and 6 are views illustrating effectiveness of embodiments of the inventive concept.
Figure 6:
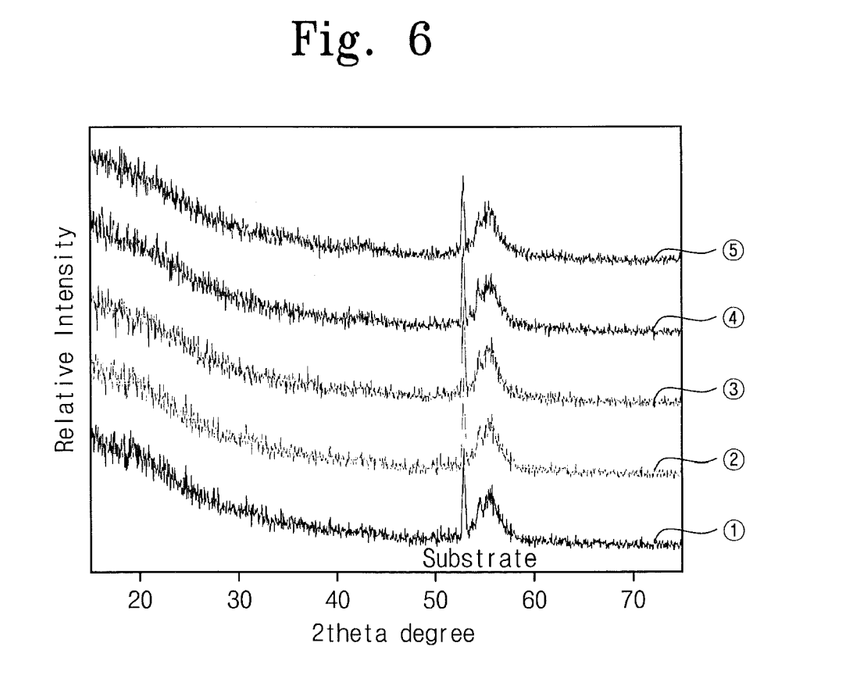

FIGS. 5 and 6 are views illustrating effectiveness of embodiments of the inventive concept. FIG. 5 is the x-ray photoelectron spectroscopy (XPS) analysis result of the TiSiN layer that is formed in accordance with the embodiments of the inventive concept, and FIG. 6 is the x-ray diffractometer (XRD) analysis result of the TiSiN layer.

In some embodiments of the inventive concept, TDMAT was used as the first precursor, Bis(tertiary-butylamino)silane (BTBAS) was used as the second precursor, ammonia gas ($NH_3$) was used as the substitute gas, and argon gas was used as the purging gas. The titanium silicon nitride was formed at 400° C. and 0.7 Torr.

Referring to FIG. 5, a peak is observed at −281.6 eV. This peak is caused by carbide that is formed of silicon and carbon. This result shows that carbon bonded to silicon exists in the titanium silicon nitride layer.

FIG. 6 shows the result of an endurance test of the titanium silicon nitride layer that is formed in accordance with embodiments of the inventive concept. FIG. 6 also shows crystallinity of titanium silicon nitride layers immediately after deposition and after subsequent thermal treatment. Curve ① shows crystallinity of titanium silicon nitride layer immediately after deposition. Curves ②, ③, ④ and ⑤ show crystallinity of titanium silicon nitride layers after thermal treatment for 2 minutes at 500° C., 650° C., 700° C. and 800° C., respectively. In each curve, peaks nearby 52 are caused by the substrate, and peaks nearby 57 are caused by the titanium silicon nitride layer. Identical 2 theta degree signifies that an identical state of crystal is contained.

As shown in FIG. 6, TiSiN formed according to the embodiment of the inventive concept is not being changed in crystallinity even if high temperature thermal treatment is performed on the TiSiN. That is, the layers that are formed according to embodiments of the inventive concept can have improved endurance.

According to embodiments of the inventive concept, the substituent of the precursor can be substituted with the substitute gas in the chamber spaced apart from the substrate. Thus, the substituent of the precursor can be more easily substituted with the substitute gas such that impurities and/or a composition of elements in a layer can be more effectively controlled. Therefore, the electrical characteristics of the layer are facilitated and may be controlled.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method of forming a semiconductor device comprising:
providing a first precursor and a substitute gas into a reaction chamber having a substrate therein, the first precursor having first substituents; and
providing a second precursor into the reaction chamber, wherein either of the first precursor or the second precursor comprises a metal element and the other includes a silicon element, at least one of the first substituents of the first precursor are substituted with the substitute gas at a region spaced apart from the substrate, the first precursor substituted with the substitute gas is adsorbed onto the substrate, and the second precursor is reacted with the adsorbed first precursor, wherein the first substituent is NRR', wherein each of R and R' is one selected from the group consisting of $C_nH_{2n+1}$, wherein n is an integral number in the range from 0 to 10, $C_nH_{2n-1}$, wherein n is an integral number in the range from 1 to 12, and —CH=C=$CH_2$.

2. The method of claim 1, wherein at least one of the first substituents is substituted with the substitute gas after adsorbing the first precursor on the substrate.

3. The method of claim 1, wherein the first precursor and the substitute gas are simultaneously provided into the reaction chamber.

4. The method of claim 1, wherein at least one of the first substituents is substituted with the substitute gas by transamination between the first precursor and the substitute gas.

5. The method of claim 1, wherein the substitute gas is $NR_nH_{3-n}$, or $N_2R_nH_{4-n}$, wherein n is an integral number in the range from 0 to 2.

6. The method of claim 1, wherein the first substituents comprise the same amine group as the substitute gas.

7. The method of claim 1, wherein the second precursor comprises a second substituent and the method further comprises:
providing a substitute gas into the reaction chamber; and
substituting the second substituent with the substitute gas.

8. A method of forming a semiconductor device comprising:
providing a first precursor having first substituents and a first substitute gas having a first amine group into a reaction chamber having a substrate;
substituting at least one of the first substitents with the first amine group;

adsorbing the first precursor having the first amine group on the substrate;

providing a second precursor having second substituents and a second substitute gas having a second amine group into the reaction chamber;

substituting at least one of second substitents with the second amine group; and binding the second precursor having the second amine group to the first precursor having the first amine group on the substrate, wherein either of the first precursor or the second precursor comprises a metal element and the other includes a silicon element.

9. The method of claim 8, wherein at least one of the first substituents is substituted with the first amine group at a region spaced apart from the substrate.

10. The method of claim 8, wherein the first substituents are substituted with the first amine group by transamination between the first precursor and the substitute gas.

11. The method of claim 10, wherein the first substituents are NRR', wherein each of R and R' is one selected from the group consisting of $C_nH_{2n+1}$, wherein n is an integral number in the range from 0 to 10, $C_nH_{2n-1}$, wherein n is an integral number in the range from 1 to 12, and —CH=C=CH$_2$.

12. The method of claim 10, wherein the substitute gas is $NR_nH_{3-n}$ or $N_2R_nH_{4-n}$, wherein n is an integral number in the range from 0 to 2.

13. The method of claim 10, wherein the first substituents comprise the same amine group as the substitute gas.

14. A method of forming a phase changeable memory device comprising:

forming a heating electrode on a substrate; and forming a phase changeable layer on the heating electrode, wherein forming the heating electrode includes providing a first precursor having first substituents and a substitute gas into a reaction chamber having the substrate with the heating electrode; and providing a second precursor into the reaction chamber, wherein either of the first precursor or the second precursor comprises a metal element and the other includes a silicon element, at least one of the first substituents of the first precursor is substituted with the substitute gas at a region spaced apart from the substrate, the first precursor substituted with the substitute gas is adsorbed onto the substrate, and the second precursor is reacted with the adsorbed first precursor.

* * * * *